United States Patent
Guha (10) Patent No.: US 9,147,581 B2
(45) Date of Patent: Sep. 29, 2015

(54) DUAL CHAMBER PLASMA ETCHER WITH ION ACCELERATOR

(71) Applicant: Lam Research Corporation, Fremont, CA (US)

(72) Inventor: Joydeep Guha, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/939,709

(22) Filed: Jul. 11, 2013

(65) Prior Publication Data

US 2015/0017810 A1    Jan. 15, 2015

(51) Int. Cl.
| | |
|---|---|
| H01L 21/3065 | (2006.01) |
| C23F 4/00 | (2006.01) |
| H01L 21/67 | (2006.01) |
| H01L 21/311 | (2006.01) |
| H01J 37/32 | (2006.01) |

(52) U.S. Cl.
CPC .............. *H01L 21/3065* (2013.01); *C23F 4/00* (2013.01); *H01J 37/32357* (2013.01); *H01J 37/32422* (2013.01); *H01L 21/31116* (2013.01); *H01L 21/67069* (2013.01); *H01J 2237/334* (2013.01)

(58) Field of Classification Search
CPC .................... H01L 21/3065; H01L 21/67069; H01L 21/31116; H01J 37/32357; H01J 37/32422; H01J 2237/3341
See application file for complete search history.

(56) References Cited

U.S. PATENT DOCUMENTS

| 4,600,464 A | 7/1986 | Desilets et al. |
| 6,007,673 A | 12/1999 | Kugo et al. |

(Continued)

FOREIGN PATENT DOCUMENTS

| CN | 02834905 A | 12/2012 |
| JP | 07235397 A | 9/1995 |

(Continued)

OTHER PUBLICATIONS

S. Wolf and R.N. Tauber, Silicon Processing for the VLSI Era, vol. 1, Lattice Press, ISBN 0-9616721-6-1, year 2000, pp. 673-676.*

(Continued)

*Primary Examiner* — Lan Vinh
*Assistant Examiner* — Jiong-Ping Lu
(74) *Attorney, Agent, or Firm* — Weaver Austin Villeneuve & Sampson LLP (57) ABSTRACT

The embodiments herein generally deal with semiconductor processing methods and apparatus. More specifically, the embodiments relate to methods and apparatus for etching a semiconductor substrate. A partially fabricated semiconductor substrate is provided in a reaction chamber. The reaction chamber is divided into an upper sub-chamber and a lower sub-chamber by a grid assembly. Plasma is generated in the upper sub-chamber, and the substrate is positioned in the lower sub-chamber. The grid assembly includes at least two grids, each of which is negatively biased, and each of which includes perforations which allow certain species to pass through. The uppermost grid is negatively biased in order to repel electrons. The lowermost grid is biased further negative (compared to the uppermost grid) in order to accelerate positive ions from the upper to the lower sub-chamber. Etching gas is supplied directly to the lower sub-chamber. The etching gas and ions react with the surface of the substrate to etch the substrate as desired.

12 Claims, 5 Drawing Sheets

(56) References Cited

U.S. PATENT DOCUMENTS

| | | |
|---|---|---|
| 6,013,580 A | 1/2000 | Yanagida |
| 6,101,970 A | 8/2000 | Koshimizu |
| 6,162,323 A | 12/2000 | Koshimizu |
| 6,689,283 B2 | 2/2004 | Hattori et al. |
| 6,851,384 B2 | 2/2005 | Yuda et al. |
| 7,244,474 B2 | 7/2007 | Hanawa et al. |
| 7,291,360 B2 | 11/2007 | Hanawa et al. |
| 7,520,999 B2 | 4/2009 | Chandrachood et al. |
| RE40,951 E | 11/2009 | Kodaira et al. |
| 7,695,590 B2 | 4/2010 | Hanawa et al. |
| 7,767,561 B2 | 8/2010 | Hanawa et al. |
| 7,909,961 B2 | 3/2011 | Kumar et al. |
| 8,058,156 B2 | 11/2011 | Hanawa et al. |
| 8,349,128 B2 | 1/2013 | Todorow et al. |
| 8,356,575 B2 | 1/2013 | Sasaki et al. |
| 2002/0179248 A1 | 12/2002 | Kabansky |
| 2004/0014325 A1 | 1/2004 | Laermer et al. |
| 2004/0221958 A1 | 11/2004 | Loewenhardt et al. |
| 2005/0025791 A1 | 2/2005 | Remenar et al. |
| 2005/0211171 A1 | 9/2005 | Hanawa et al. |
| 2005/0211546 A1 | 9/2005 | Hanawa et al. |
| 2005/0211547 A1 | 9/2005 | Hanawa et al. |
| 2005/0287811 A1 | 12/2005 | Inukai |
| 2006/0000805 A1 | 1/2006 | Todorow et al. |
| 2006/0021701 A1 | 2/2006 | Tobe et al. |
| 2006/0102286 A1* | 5/2006 | Kim .................. 156/345.35 |
| 2007/0000611 A1 | 1/2007 | Shannon et al. |
| 2007/0017898 A1 | 1/2007 | Kumar et al. |
| 2007/0068624 A1* | 3/2007 | Jeon et al. .................. 156/345.4 |
| 2007/0247073 A1 | 10/2007 | Paterson et al. |
| 2008/0178805 A1 | 7/2008 | Paterson et al. |
| 2011/0177694 A1 | 7/2011 | Chen et al. |
| 2012/0031559 A1 | 2/2012 | Dhindsa et al. |
| 2012/0034786 A1 | 2/2012 | Dhindsa et al. |
| 2012/0104274 A1 | 5/2012 | Hirayanagi et al. |
| 2012/0273130 A1 | 11/2012 | Drewery et al. |
| 2012/0322011 A1 | 12/2012 | Wu et al. |
| 2013/0059448 A1 | 3/2013 | Marakhtanov et al. |
| 2014/0054269 A1 | 2/2014 | Hudson et al. |
| 2014/0251790 A1* | 9/2014 | Kodaira et al. .......... 204/192.34 |
| 2014/0302678 A1 | 10/2014 | Paterson et al. |
| 2014/0302680 A1 | 10/2014 | Singh et al. |
| 2014/0302681 A1 | 10/2014 | Paterson et al. |
| 2015/0011093 A1 | 1/2015 | Singh et al. |

FOREIGN PATENT DOCUMENTS

| | | |
|---|---|---|
| JP | 2604684 B2 | 4/1997 |
| JP | 2012531520 A | 12/2012 |

OTHER PUBLICATIONS

U.S. Patent Application entitled "Internal Plasma Grid for Semiconductor Fabrication," Singh et al., U.S. Appl. No. 13/916,318, filed Jun. 12, 2013.

U.S. Patent Application entitled "Plasma-Enhanced Ethching in an Augmented Plasma Processing System,", Bailey et al., U.S. Appl. No. 13/623,793, filed Sep. 25, 2012.

U.S. Patent Application entitled "Ion Beam Etching System," Singh et al., U.S. Appl. No. 13/936,930, filed Jul. 8, 2013.

Suda et al., (2012) "Development of Cu Etching Using $O_2$ Cluster Ion Beam under Acetic Acid Gas Atmosphere", Japanese Journal of Applied Physics, 51:08HA02-1-08HA02-5.

U.S. Patent Application entitled "Ion to Neutral Control for Wafer Plasma Source Reactor," Dhindsa et al., U.S. Appl. No. 14/033,241, filed Sep. 20, 2013.

U.S. Patent Application entitled "Ion Beam Etching System," Singh et al., U.S. Appl. No. 14/637,260, filed Mar. 3, 2015.

US Office Action, dated Jan. 14, 2015, issued in U.S. Appl. No. 13/916,318.

US Notice of Allowance, dated Jan. 16, 2015, issued in U.S. Appl. No. 13/936,930.

US Office Action, dated Oct. 11, 2013, issued in U.S. Appl. No. 13/626,793.

US Final Office Action, dated Feb. 13, 2014, issued in U.S. Appl. No. 13/626,793.

US Office Action, dated Jul. 16, 2014, issued in U.S. Appl. No. 13/626,793.

US Notice of Allowance, dated Jan. 2, 2015, issued in U.S. Appl. No. 13/626,793.

US Office Action, dated May 21, 2014, issued in U.S. Appl. No. 13/227,404.

Xiao, (2001) "Introduction to Semiconductor Manufacturing Technology", Published by Prentice Hall, ISBN 0-13-022404-9, Chapter 7, p. 230.

* cited by examiner

DUAL CHAMBER PLASMA ETCHER WITH ION ACCELERATOR

BACKGROUND

One operation frequently employed in the production of semiconductors is an etching operation. In an etching operation, one or more materials are partly or wholly removed from a partially fabricated integrated circuit. Plasma etching is often used, especially where the geometries involved are small, high aspect ratios are used, or precise pattern transfer is needed.

Typically, a plasma contains electrons, as well as positive and negative ions, and some radicals. The radicals, positive ions, and negative ions interact with a substrate to etch features, surfaces and materials on the substrate.

With the move from planar to 3D transistor structures (e.g., FinFET gate structures for logic devices) and advanced memory structures such as Magnetoresistive Random Access Memory (MRAM), plasma etching processes need to be increasingly precise and uniform in order to produce quality products. One problem with conventional etching techniques is that etching byproducts, instead of being swept away, are sometimes re-deposited on surfaces where such deposition is not desired. For example, the byproducts may deposit back on the substrate, where they interfere with further etching, or on the etching apparatus. In many cases, the etch byproducts that are re-deposited are dissociation products of other etching byproducts.

Unwanted deposition on the substrate can cause many problems including poor etch results (e.g., a non-vertical etching profile, etching non-uniformities, etc.) and sub-standard substrates (e.g., the unwanted deposition may form a short in an etched stack). Unwanted deposition on the apparatus can cause additional problems including an increased need for cleaning, shorter apparatus lifespans, and less efficient operation of the apparatus.

Thus, there exists a need for improved semiconductor fabrication methods and apparatus which prevent re-deposition of byproducts during etching.

SUMMARY

Certain embodiments herein relate to methods and apparatus for etching a semiconductor. In one aspect of the embodiments herein, a method is provided for etching a semiconductor including the steps of (a) receiving a substrate having material for removal thereon in a reaction chamber of a reactor, where the reactor includes (i) an upper sub-chamber and a lower sub-chamber, (ii) a grid assembly positioned in the reaction chamber dividing the reaction chamber into the upper and lower sub-chambers, where the grid assembly includes at least an uppermost and lowermost grid, each connected to a power supply for independently providing negative bias to the grids, where each grid has perforations extending through the thickness of the grid, (iii) one or more inlets to the upper sub-chamber, (iv) one or more inlets to the lower sub-chamber, and (v) a plasma generation source designed or configured to produce a plasma in the upper sub-chamber, (b) supplying a plasma generating gas to the upper sub-chamber and generating a plasma from the plasma generating gas, (c) applying a negative bias to at least the uppermost and lowermost grids of the grid assembly, where the bias applied to the lowermost grid is more negative than the bias applied to the uppermost grid, (d) supplying an etching gas to the lower sub-chamber through the one or more inlets to the lower sub-chamber, and (e) etching the substrate to remove at least a portion of the material for removal, where the lower sub-chamber is substantially free of plasma during operations (a)-(e).

In some cases, the bias applied to the uppermost grid is between about −0.5 to −50 V, or between about −5 to −50 V. The bias applied to the lowermost grid may be between about −0.5 to −2000 V. In some embodiments, the bias applied to at least one grid of the grid assembly changes during operation (c). The etching gas may be supplied in pulses during operation (d) in certain cases.

The plasma generating gas may include an inert gas. In these or other cases, the plasma generating gas may include a reactive gas. The material for removal may be selected from the group consisting of Fe, Mn, Ni, Mg, Pt, Pd, Co, Ru, Cu, Ir, and a combination thereof. In some implementations, the method may further include supplying a processing gas to the lower sub-chamber and reacting the processing gas with the material for removal to form a reacted layer for removal. The reacted layer for removal may include an oxide, a nitride, a hydride, a chloride, a fluoride, organometallic complexes, or a combination thereof. The method may further include reacting the reacted layer for removal with the etching gas to remove the reacted layer for removal.

In various embodiments, the method may further include moving at last one grid of the grid assembly during at least one of operations (b)-(e). The movement may include rotation. In some cases, ions present in the upper sub-chamber accelerate through the grid assembly and interact with a surface of the substrate.

In another aspect of the disclosed embodiments, a method is disclosed for etching a substrate, including (a) generating a plasma in an upper region of a plasma reactor, (b) accelerating ions from the plasma onto a surface of the substrate in a lower region of the plasma reactor, where the plasma does not contact the substrate, (c) delivering an etchant gas to a surface of the substrate where the etchant gas reacts to etch metal or semiconductor from the surface and produce a volatile byproduct containing one or more atoms of the metal or semiconductor and one or more ligands from the etchant gas, and (d) removing the volatile byproduct from the plasma reactor without having the byproduct substantially contact the plasma and without having the volatile byproduct substantially dissociate to a less volatile material. In some cases, the etchant gas reacts in operation (c) to etch a metal selected from the group consisting of Fe, Mn, Ni, Mg, Pt, Pd, Co, Ru, Cu, Ir, and a combination thereof.

In a further aspect of the disclosed embodiments, an apparatus for etching a substrate is provided, including (a) a reaction chamber, (b) a grid assembly positioned in the reaction chamber dividing the reaction chamber into an upper sub-chamber and a lower sub-chamber, where the grid assembly includes at least an uppermost grid and a lowermost grid, and where each grid in the grid assembly has perforations extending through the thickness of the grid, (c) electrical connections with at least the uppermost and lowermost grids of the grid assembly for independently providing negative bias to the uppermost and lowermost grids, (d) one or more gas inlets to the upper sub-chamber, (e) one or more gas inlets to the lower sub-chamber, (f) a plasma generation source designed or configured to produce a plasma in the upper sub-chamber, and (h) a controller designed or configured to provide instructions for (i) supplying a plasma generating gas to the upper sub-chamber and generating a plasma from the plasma generating gas, (ii) applying a negative bias to at least the uppermost and lowermost grids of the grid assembly, where the bias applied to the lowermost grid is more negative than the bias applied to the uppermost grid, and (iii) supplying an etching gas to the lower sub-chamber.

In some embodiments, a ratio of the height of the upper sub-chamber to the height of the lower sub-chamber may be between about 0.1-10 in some cases. The grid assembly may be designed or configured to serve as one or more of the inlets in (c) and (d). The grid assembly may also be designed or configured to provide different levels of ion flux to different portions of a substrate surface. The grid assembly may also include cooling channels embedded in the assembly. In some implementations, at least one grid of the grid assembly is movable. Further, in some embodiments, the grid assembly may include more than two grids. In various embodiments, the plasma generation source includes one or more plasma coils positioned above the upper sub-chamber. In other embodiments, the plasma generation source is a capacitively coupled plasma source.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Further, though the description often refers to "upper" and "lower" elements (or similarly to "top" and "bottom," "left" and "right," etc.) these descriptors are used in a non-limiting fashion, solely for the sake of clarity. One of ordinary skill in the art would understand that other configurations may be used, as well. In certain embodiments, elements which are described herein as "upper" and "lower" may become the "lower" and "upper" or "left" and "right" elements, for example.

Figure 1:
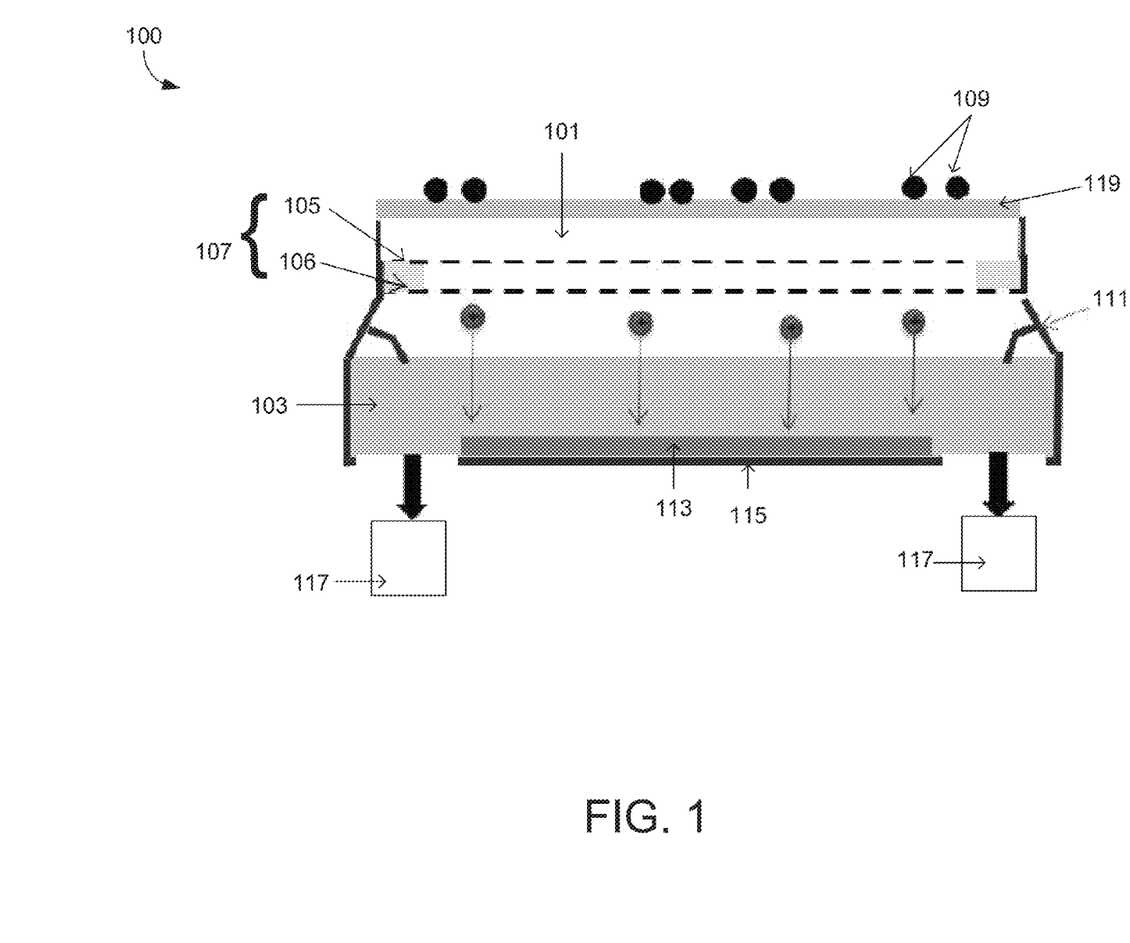
FIG. 1 is a simplified cross-sectional view of an etching apparatus according to various disclosed embodiments.

The embodiments herein generally deal with semiconductor processing methods and apparatus. More specifically, the embodiments relate to methods and apparatus for etching a semiconductor substrate. In practicing the disclosed techniques, a substrate is provided in a processing chamber. FIG. 1 shows a simplified cross-sectional view of an appropriate processing apparatus 100. A grid assembly 107 divides the processing chamber into an upper sub-chamber 101 (where plasma is generated) and a lower sub-chamber 103 (where the substrate is situated, and where no plasma is present in many embodiments). The grid assembly 107 includes at least two grids 105 and 106, each of which typically has a negative bias during processing. During processing, the upper grid 105 may be biased negative (as compared to ground) to repel electrons, and the lower grid 106 may be biased further negative (as compared to the upper grid) in order to accelerate positive ions toward the substrate 113, which is supported by a wafer support 115.

Plasma is primarily or exclusively generated in the upper sub-chamber 101 through a plasma generating device. In the embodiment of FIG. 1, an inductively coupled plasma is generated through the use of coils 109 separated from the upper sub-chamber 101 by a dielectric window 119, though other plasma generation techniques may be used. The gas used to generate the plasma is referred to as the plasma generating gas. Positive ions pass through the slots/holes in the upper grid (i.e., uppermost grid) 105 and lower grid (i.e., lowermost grid) 106 as shown, and are accelerated by the lower grid 106 as they pass through. These positive ions strike the surface of the substrate 113, thereby activating the surface for reaction. A process gas inlet 111 delivers processing gas directly to the lower sub-chamber 103. By providing the process gas or gasses directly to the lower sub-chamber 103, they are shielded from the plasma in the upper sub-chamber 101. Similarly, after the process gas reacts with the substrate 113, the etching byproducts are shielded from the plasma in the upper sub-chamber 101. This shielding helps prevent dissociation of the etching byproducts, and therefore helps prevent re-deposition of the byproducts on the substrate 113 and apparatus 100. The byproducts are instead removed from the reaction chamber in volatile form through the use of a vacuum 117 applied to the chamber. In this way, superior etching results are achieved. Although FIG. 1 shows two vacuum sources 117, only a single vacuum source is needed in certain embodiments. In some cases, a single vacuum source connects with multiple outlets of the lower sub-chamber 103.

Figure 4A:
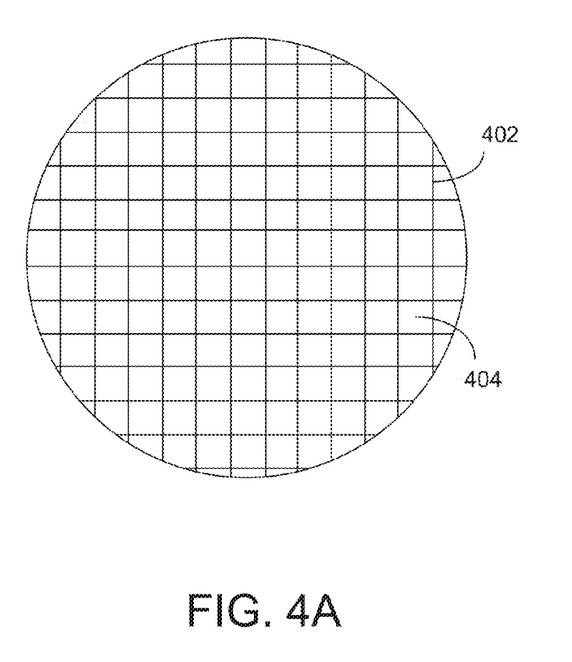
FIGS. 4A-B each show a potential embodiment of a grid that may be used in a grid assembly in accordance with various embodiments herein.
Figure 4B:
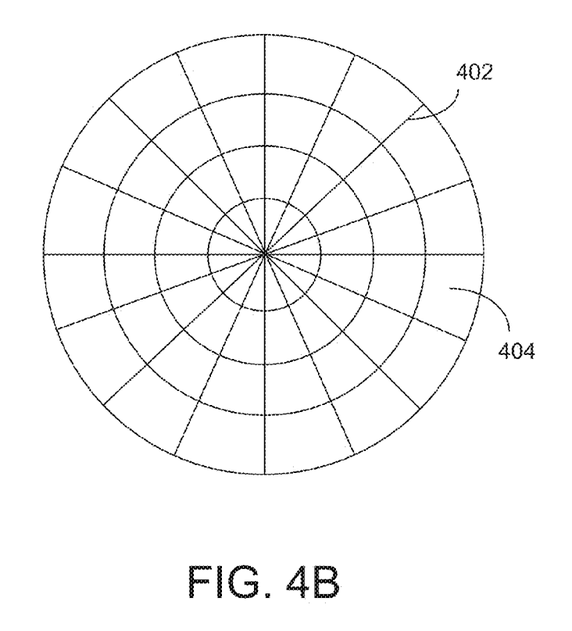

A more detailed example of a plasma reactor in accordance with the present disclosure is described below with reference to FIG. 5. Examples of grid structures suitable for use as upper and lower grids 105 and 106 are shown in FIGS. 4A and 4B.

Methods

Figure 2:
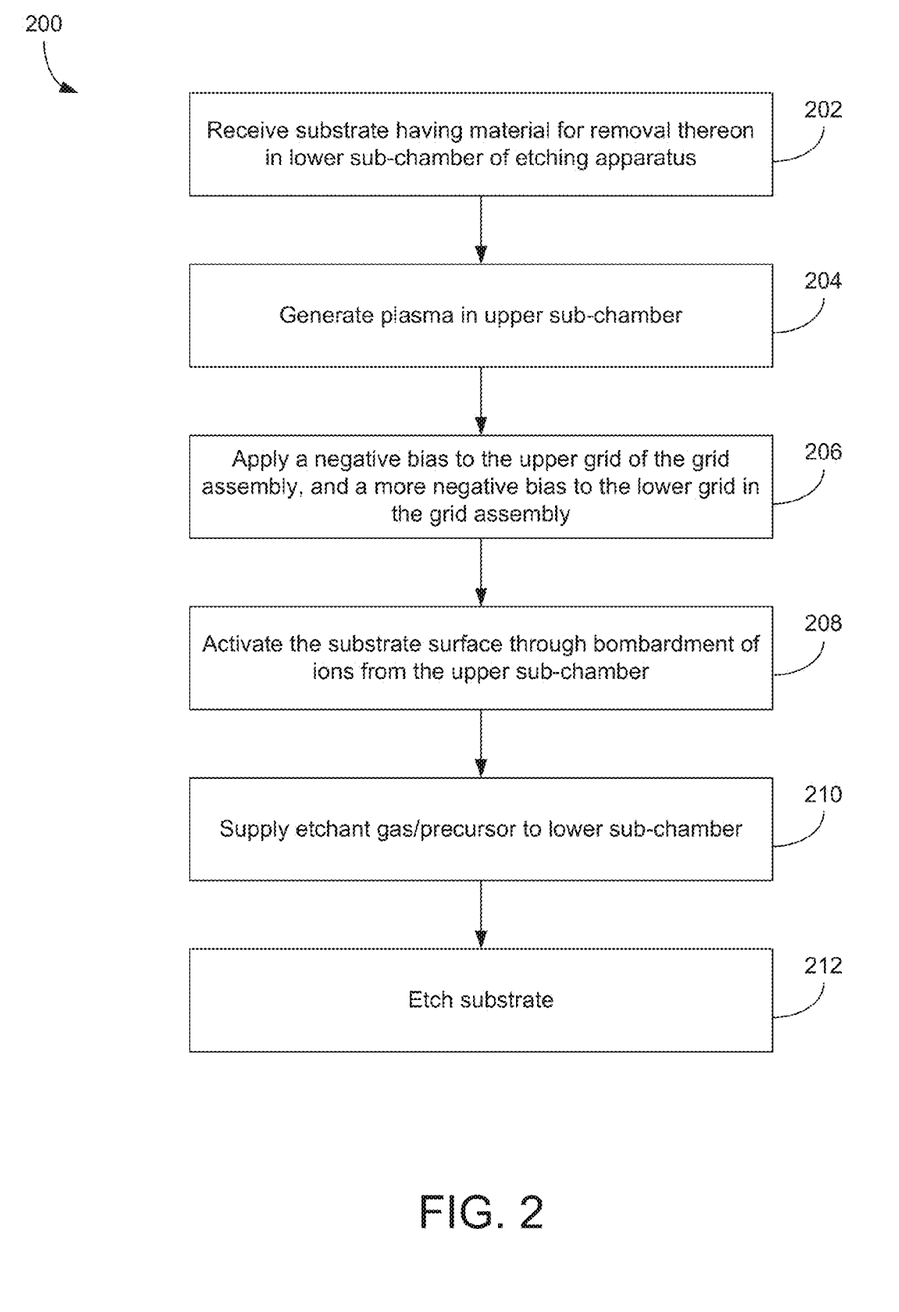
FIG. 2 is a flowchart illustrating a method of etching a substrate according to certain disclosed embodiments.

FIG. 2 provides a flow chart for etching a material in accordance with various embodiments herein. Process 200 begins at block 202 where a substrate having material for removal thereon is received in a reaction chamber. As noted above, the reaction chamber is divided into an upper sub-chamber and a lower sub-chamber by a grid assembly. The substrate is received in the lower sub-chamber, and is typically positioned on a substrate holder such as an electrostatic chuck. At block 204, a plasma is generated in the upper sub-chamber. Due to the presence of the grid assembly, the plasma is generally confined to the upper sub-chamber and does not extend substantially or at all into the lower sub-chamber. However, certain species such as positive ions and radicals in the plasma are able to pass through the grid to reach the lower sub-chamber and interact with the substrate, as explained below.

At block 206, a negative bias (as compared to ground) is applied to each of the grids in the grid assembly. A negative bias is applied to the upper grid of the assembly in order to confine the plasma to the upper sub-chamber. It may accomplish this by repelling electrons and thereby preventing bleeding of electrons into the lower sub-chamber. A greater negative bias is applied to the lower grid of the assembly in order to accelerate positive ions through the grid assembly and toward the surface of the substrate. The energy of the ions leaving the grid assembly is determined by the bias set on the lower grid. Thus, the bias on the lower grid can be optimized for a particular application to provide a desired ion energy. At block 208, the accelerated positive ions travel from the grid assembly, through the lower sub-chamber, and bombard the surface of the substrate in order to activate the surface for reaction. At block 210, one or more etchant gases/precursors are provided to the lower sub-chamber, and at block 212 the substrate is etched. In some cases, the material provided in block 210 directly etches the substrate. In other cases, the material provided reacts with another material (e.g., another reactant gas) in order to produce the compound which etches the substrate. The operations related in FIG. 2 do not necessarily occur in the order listed, and in many cases there is overlap between the operations. For example, etching typically occurs at block 212 while an etchant gas is still being supplied to the chamber at block 210. Further, in certain embodiments, the operations at blocks 204, 206, and 208 are performed concurrently. The three operations may begin at the same time or one may start before another.

FIGS. 3A-F show cross-sectional views illustrating part of a semiconductor microfabrication method according to a specific embodiment. In particular, FIGS. 3A-F relate to a broader fabrication context in which the etching process described in FIG. 2 may take place. This broader semiconductor fabrication method is further discussed and described in U.S. Pat. No. 6,689,283, titled DRY ETCHING METHOD, MICROFABRICATION PROCESS AND DRY ETCHING MASK; and U.S. Pat. No. RE40,951, titled DRY ETCHING METHOD FOR MAGNETIC MATERIAL, each of which is incorporated herein by reference in its entirety.

Figure 3A:
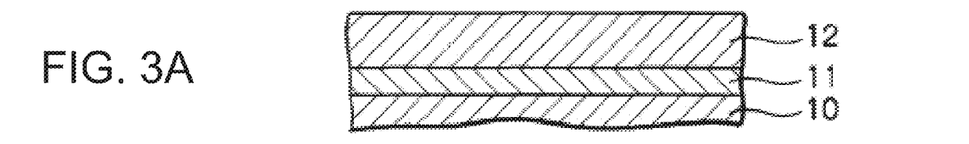
FIGS. 3A-F illustrate a partially fabricated integrated circuit at various stages during fabrication.
Figure 3B:
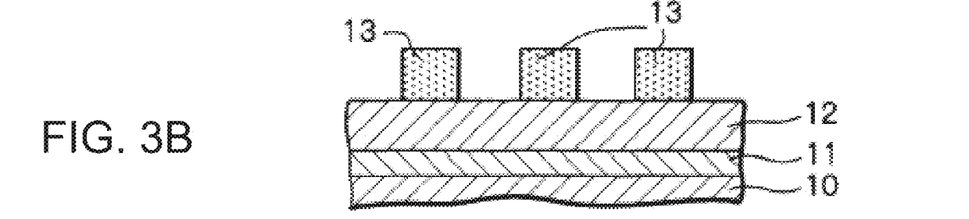

First, as shown in FIG. 3A, a layer to be etched 12 is deposited on an under layer 11 formed on a substrate 11. In a specific embodiment, the substrate is a silicon wafer, the under layer 11 is titanium, and the layer to be etched is a cobalt-platinum alloy. Then, as shown in FIG. 3B, a resist layer 13 is deposited on the layer to be etched 12. The resist layer 13 is micro-patterned using a lithography technique. In a particular case, the patterned resist layer 13 is formed on the layer 12 by coating a positive-type resist using, e.g., a spin-coating method, exposing a micro-pattern using UV or electron-beam exposure equipment, and then developing the exposed resist pattern.

Figure 3C:
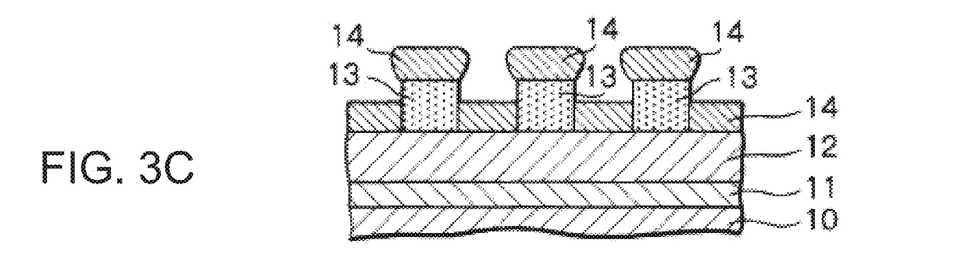
Figure 3D:
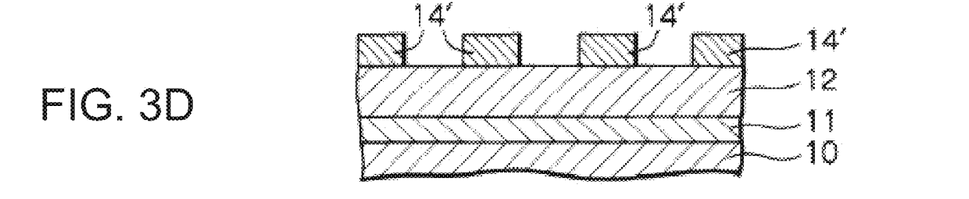
Figure 3E:
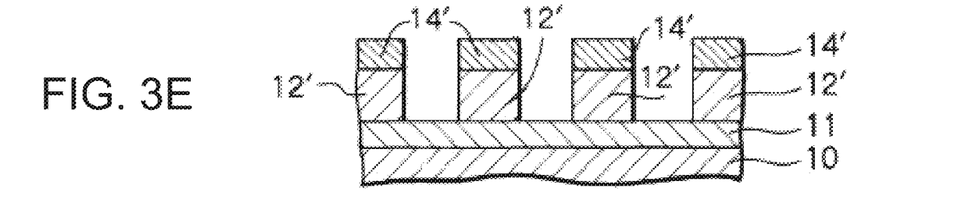
Figure 3F:
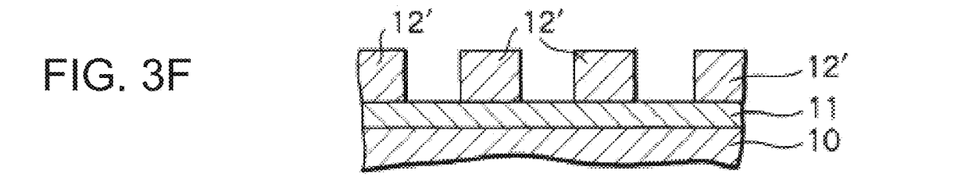

Then, as shown in FIG. 3C, a mask layer 14 is deposited on the micro-patterned resist layer 13. In some cases the mask layer is made of titanium nitride (TiN), which may be deposited through a reactive sputtering method. Next, as shown in FIG. 3D, the resist layer 13 is removed by the lift-off method to form a patterned mask 14'. More concretely, the lift-off may be performed using an ultrasonic washer by dipping the wafer into a solvent such as a tetrahydrofuran, for example. Thereafter, the substrate is dry etched according to the techniques described elsewhere herein to form etched layer 12', as shown in FIG. 3E. Finally, the mask layer 14 may be removed after etching, as shown in FIG. 3F. The preceding description is merely exemplary in nature and illustrates one particular context in which the disclosed embodiments may be practiced.

Etching Chemistry

The difficulty of a semiconductor etching process is significantly affected by the vapor pressure of the etch byproducts and their dissociation products. In fact, the formation of low vapor pressure dissociation products is a primary reason why etching certain materials (e.g., Fe, Mn, Ni, Mg, Pt, Pd, Co, Ru, Cu, Ir and the like) is so challenging. The techniques herein address certain problems associated with these difficult-to-etch materials. The description herein uses the terms direct byproduct, etch byproduct, and byproduct interchangeably. An example of a direct byproduct is $Pd(PF_3)_4$ in Reaction 1, below. The term dissociation product is understood to mean a product that results from dissociation of a direct etch byproduct. An example of a dissociation product in the context of Reaction 1 is $Pd(PF_3)_3$.

Various materials removed in an etching operation will form volatile compounds upon reaction with an etching gas. Oftentimes these volatile reaction products are metal-containing compounds, which in some cases have organic ligands. Reactions 1 and 2, below, show examples of etching reactions that form volatile byproducts.

$$Pd + 4PF_3 \rightarrow Pd(PF_3)_4 \uparrow \qquad \text{Reaction 1}$$

$$Co + \tfrac{1}{2}H_2 + 4CO \rightarrow CoH(CO)_4 \uparrow \qquad \text{Reaction 2}$$

$$Fe + 5CO \rightarrow Fe(CO)_5 \uparrow \qquad \text{Reaction 3}$$

In the case of Reaction 1, Pd is the material to be etched, $PF_3$ is the etching chemistry, and $Pd(PF_3)_4$ is the volatile byproduct. Similarly, in the case of Reaction 2, Co is the material to be etched, CO and $H_2$ are the etching chemistry, and $CoH(CO)_4$ is the volatile byproduct. Removal of one or more ligands from such byproducts can have a significant negative impact on vapor pressure. For example, $CoH(CO)_3$ has a much lower vapor pressure than $CoH(CO)_4$. As a result of the low vapor pressure of $CoH(CO)_3$ and similar dissociation products, these materials are likely to redeposit on the substrate and/or apparatus.

The material to be etched may contain a magnetic material, such as those used in magnetoresistive random accessible memory devices. In certain cases, the material to be etched includes Fe, Mn, Ni, Mg, Pt, Pd, Co, Ru, Cu, and/or Ir. In these or other cases, the reactant used to etch the material includes phosphorus trifluoride ($PF_3$), carbonyl fluoride ($COF_2$), carbon monoxide (CO), nitric oxide (NO), methanol ($CH_3OH$), ethanol ($C_2H_5OH$), acetylacetone ($C_5H_8O_2$), hexafluoroacetylacetone ($C_5H_2F_6O_2$), thionyl chloride ($SOCl_2$), thionyl fluoride ($SOF_2$), acetic acid ($CH_3COOH$), pyridine ($C_5H_5N$), and/or formic acid (HCOOH). In various embodiments, a combination of these etching reactants is used. For example, in some cases a combination of CO+NO is used to form nitrosyl carbonyl of metal. In another case, a combination of $CO_2+NO_2$ is used. In a further case, pyridine is combined with thionyl chloride and/or thionyl fluoride. Other combinations are possible, as well. These materials and reactions are merely exemplary and are not meant to limit the embodiments in any way. One of ordinary skill in the art would understand that the techniques herein may be used with a variety of materials and reactions.

The stability of the volatile byproducts is significantly compromised when the byproducts are exposed to a plasma environment, and in particular when exposed to high energy electrons present in a plasma environment. This is problematic because for many etching reactions to be successful, the surface of the substrate must be activated in some way. The activation often occurs through ion bombardment of the surface.

Without wishing to be bound by any theory or mechanism of action, it is believed that ion bombardment may generate active sites by creating dangling bonds and/or other physicochemically receptive features on the metal or other material to be etched. Activation by ion bombardment is conventionally achieved through exposure to plasma. Typically, the plasma is generated in a region immediately above the substrate, and an electrostatic chuck used to support the substrate may be negatively biased to attract positive ions onto the substrate's surface. In some conventional implementations, the electrostatic chuck may be energized to a degree that the chuck itself produces a plasma immediately above the substrate.

Because the byproducts are often quite large/bulky, with many ligands attached to a central atom, it is relatively common for energetic particles in the plasma (particularly electrons) to remove one or more of the ligands through dissociation. When even a single ligand is removed, the byproduct is usually no longer volatile, and is therefore likely to re-deposit on the substrate or apparatus.

The embodiments herein prevent re-deposition of the byproducts and associated dissociation products by providing a reaction chamber separated into an upper sub-chamber (for plasma generation) and a lower sub-chamber (for substrate processing) by a grid assembly that shields the etching chemistry/byproducts/dissociation products from exposure to a plasma environment.

In some cases, the process gas supplied to the lower sub-chamber during the etching process includes not only the etchant gas but one or more other gases (which may be referred to as a second process gas, third process gas, additional process gas, etc.). The additional gas may be, for example, oxygen, hydrogen or nitrogen. In other cases the additional gas may include chlorine, fluorine, or another material. This gas may react with the surface of the substrate to form a metal oxide, metal hydride, metal nitride, metal chloride, metal fluoride, or other organometallic complexes, for example. This oxide/hydride/nitride/chloride/fluoride/etc. material may be easier to etch than the bare metal, in some cases. The additional gas may be supplied continuously or in pulses. When pulsed, the second process gas may be supplied in an alternate repeating cycle of pulsed etching gas and pulsed second process gas.

In another embodiment, the material which drives formation of the oxide/hydride/nitride/chloride/fluoride/etc. is delivered in ionized form from the upper sub-chamber to the lower sub-chamber. In some implementations, the surface of the substrate is exposed to an alternating stream of chemically inert ions and chemically reactive ions.

Delivery of the process gases to the upper and lower sub-chambers may be accomplished by any of various means. In one embodiment, inlet nozzles are positioned in the top and lower sub-chambers. There may be a plurality of inlets for each sub-chamber. In one implementation, many inlets are placed around the perimeter of the sub-chambers to provide a uniform flow of process gases. In another embodiment, one or more of the grids acts as a showerhead to provide gases to either or both of the upper and lower sub-chambers. In another case, process gases may be supplied through a central nozzle extending into each sub-chamber. One of ordinary skill in the art would understand that different forms of gas delivery may be used within the scope of the disclosed embodiments.

Plasma Generation

Plasma is generated primarily and in some cases exclusively in the upper sub-chamber. In certain cases, the plasma is generated from one or more inert gases including Ar, He, Ne, Kr and Xe. In other cases, the plasma is generated from a reactive gas such as $H_2$, $N_2$, $O_2$, etc. In some cases, a combination of inert and reactive gases is used to generate the plasma. The gas used to generate the plasma may be chosen to reduce or eliminate unwanted reactions in the reaction chamber, based in part on the etching chemistry used and the material to be etched. Typically, the plasma's role is to be a source of ions for injection into the lower sub-chamber. These ions may be chemically inert or reactive, as explained elsewhere.

Various types of plasma generation techniques may be used to generate the plasma in the upper sub-chamber. In one embodiment, the plasma is an inductively coupled plasma generated, for example, through the use of coils positioned above the upper sub-chamber. In another embodiment, the plasma is a capacitively coupled plasma. Alternatively, the plasma source may be an electron cyclotron resonance (ECR) plasma source or a helicon plasma source. In the case of an inductively coupled plasma a wide range of excitation frequencies may be used. In certain cases, the excitation frequencies are radio frequencies or microwave frequencies. In some embodiments, the plasma source coupled to the upper sub-chamber may be intensified through application of a magnetic field. An example of a plasma generation reactor that may be modified according to the teachings herein is the Kiyo reactor, available from Lam Research Corporation of Fremont, Calif.

In various embodiments, the grid assembly does not play a significant role in plasma generation. However, the grid assembly plays a role in confining the plasma to the upper sub-chamber and filtering out species for delivery to the lower sub-chamber.

Position of the Grid Assembly in the Reactor

The grid assembly is positioned in the reaction chamber, thereby dividing the reaction chamber into upper and lower sub-chambers. An example of a chamber suitable for modification to include a grid assembly as described herein is a Kiyo Reactor from Lam Research Corporation of Fremont, Calif. For context, the following description may be considered with reference to FIG. 1, which is further described above. In certain implementations, the grid assembly 107 is positioned between about 1-6 inches above the interior base of the reaction chamber, or between about 1-6 inches (e.g., between about 1.5-3 inches) above a substrate supporter 115 such as a pedestal. In these or other implementations, the grid may be positioned between about 1-6 inches (e.g., between about 1.5-3 inches) below the interior ceiling of the reaction chamber. The ceiling is often outfitted with a dielectric window.

In certain embodiments, the heights of the upper and lower sub-chambers are substantially the same (e.g., within about 5%), while in other embodiments these heights may differ more considerably. The ratio of the height of the upper chamber to the height of the lower chamber ($h_u/h_l$), also referred to as the sub-chamber height ratio, may be between about 0.1-10, or between about 0.2-5. In some embodiments, the sub-chamber height ratio is greater than about 1/6.

The grid should not be positioned too close to the wafer, as this may cause printing of the grid to occur on the wafer's face. In other words, the pattern of slots/holes in the grid may undesirably appear on the face of the wafer after processing, causing severe etch non-uniformity on the substrate surface. For many applications, a separation distance of at least about 1 inch from the top of the substrate to the bottom of the lower grid is sufficient.

Grid Assembly Design

Various designs may be used to implement the grid assembly. Generally, the grid assembly includes at least two grids. In many implementations, the grid assembly includes either 2 or 3 grids. The uppermost grid (sometimes referred to as the upper grid) is the grid closest to the upper sub-chamber. The lowermost grid (sometimes referred to as the lower grid) is the grid closest to the substrate. Each grid has a plurality of slots, holes and/or other perforations that allow ions to pass through the grids from the upper to lower sub-chamber. Non-limiting examples of grid structures are shown in FIGS. 4A-B. In a simple embodiment, a grid is constructed with wire mesh. The wires 402 may form a criss-crossing pattern as shown in FIG. 4A, with open spaces 404 between the wires 402. Alternatively, the wires 402 may form a spiderweb shape as shown in FIG. 4B. Many other grid designs are possible. In one case, for example, the perforations are T-shaped, and interlock with one another in an alternating design. In another case, the design has circular holes. In some cases, the perforations may be designed such that little or no current is induced in the grid during plasma generation. One design which ensures this result is a grid having radially directed slots. Where the apparatus is not designed to prevent this type of problem, a current may be induced to flow substantially circularly around the grid or to flow in small eddy currents on the grid, resulting in increased parasitic power consumption.

The perforations in the grids of the grid assembly should allow for direct line-of-sight between the upper and lower sub-chambers, and should be configured to confine the plasma in the upper sub-chamber. Without such line-of-sight, ions would collide with the grid and would not be able to pass through into the lower sub-chamber to activate the surface of the substrate. In some cases, the perforations have a principal dimension between about 0.5-10 mm, for example between about 1-5 mm. The principal dimension is in a direction parallel to the work piece and spanning the longest linear path in a perforation. One of ordinary skill in the art would understand that a variety of perforation designs may be used within the scope of the present disclosure.

The grid open area represents the total area over the active face of a wafer or other processing substrate, as viewed from above, through which there is a clear line-of-sight from above to below the particular grid. The assembly open area represents as the total area, as viewed from above, through which there is a clear line-of-sight through all the grids of the assembly. Both the grid open area and the assembly open area may be described in terms of absolute areas, or in terms of a percentage of the total area on the grid. For example, a 300 mm diameter grid has an area of roughly 700 cm$^2$. If the grid has about 350 cm$^2$ of open area, it may also be considered to have about 50% open area. In some cases the grid open area and the assembly open area are equal. In other cases, the assembly open area is lower than the grid open area for one or more grids. In some implementations, at least one grid has a grid open area between about 30-75%. In these or other implementations, the grid assembly open area is between about 0-75%.

In some cases, the open area of the grids/assembly is designed to provide different levels of ion flux to different parts of the substrate. For example, where the open area is concentrated toward the center of the grid, the ions may activate the center region of the wafer to a greater extent than the edges of the wafer. Likewise, where the assembly open area is concentrated near the edge of the grid assembly, the ions may activate the edge regions of the wafer to a greater degree than the center of the wafer. These techniques may be especially useful in combating center-to-edge non-uniformities, and in some cases may be implemented through movable grids, described further below.

The grids may be made from a variety of materials and may or may not be coated. Due to the bias applied to the grids during etching, the material used to construct or coat the grids should be conductive. In various embodiments, the grids are constructed from or coated with metal or a metallic alloy. In some cases, the grids may be coated with a hard carbon material. In some particular cases, the grids may be coated with a layer of $Y_2O_3$, $YF_3$, YAG, titanium nitride, or $CeO_2$. The grid material may or may not be anodized or otherwise passivated for, e.g., corrosion resistance.

The grids should be sufficiently rigid such that they do not bow or otherwise bend when placed in the reaction chamber. This helps to ensure uniform etch results.

There is some distance of separation between adjacent grids. This separation distance is generally fairly small (e.g., less than about 5 mm, less than about 3 mm, or less than about 2 mm) in order to help prevent bleeding of electrons into the lower sub-chamber. The distance of separation should be uniform across the diameter of the grids, and this uniformity can be achieved by constructing the grids with sufficiently rigid materials.

The grid assembly generally spans an entire horizontal section of the chamber. Where the chamber is circular (as viewed from above or facing the work piece), the grid will also be circular. This allows the grid to effectively divide the reaction chamber into two sub-chambers. In certain designs, the shape of the grid is defined by the geometry of the substrate (which is typically but not necessarily a circular wafer). As is well known, wafers are often provided in various sizes, such as 200 mm, 300 mm, 450 mm, etc. Other shapes are possible for square or other polygonal substrates or smaller/larger substrates. Thus, the cross-section of the grid (as viewed from above) may have a variety of shapes and sizes. Further, although a flat planar grid cross-section (as viewed from the side) is appropriate for some embodiments, other non-flat cross-sections may be appropriate in other embodiments. For example, one or more grids of the grid assembly may be dished, domed, oscillating (e.g., sinusoidal, square wave, chevron shapes), slanted, etc. Where non-planar cross-sectional grid assemblies are used, special attention should be paid to the lines-of-sight through the grids. Without a clear line-of-sight through the assembly, ions will not be able to travel through the assembly into the lower sub-chamber.

Each grid of the grid assembly may on average be between about 1-50 mm thick, or between about 5-20 mm thick. In some cases, the sum of thicknesses of the grids in the assembly is between about 2-75 mm, or between about 2-50 mm. The thicknesses depend largely on the material chosen to construct the grids and the mechanical strength of that material. If a grid is too thick, or if the perforations in the grid are too small, the grid may block too many ions from passing through (i.e., ions will collide with the grid, sometimes on a sidewall of a perforation in the grid, instead of passing through it). This would result in insufficient activation of the surface of the substrate, and the etching would be less successful. If a grid is too thin, it may not be adequately rigid, it may not be able to withstand plasma processing, and it may need to be replaced fairly often.

In some embodiments, the grid assembly contains gas delivery holes. In such embodiments, the grid assembly may serve the additional purpose of being a showerhead for the upper and/or lower sub-chambers. In these embodiments, one or more channels may be included in the upper and/or lower grids. These channels may be fed with gas from an inlet (or multiple inlets), and deliver the gas to a plurality of outlet holes in the grid(s). The outlet holes may form gas distribution showerheads that deliver process gasses to either or both of the upper and lower sub-chambers.

In some implementations, the grid has a region such as a central region containing a feature for allowing a probing apparatus to be disposed through the grid. The probing apparatus can be provided to probe process parameters associated with the plasma processing system during operation. Probing processes can include optical emission endpoint detection, interferometeric endpoint detection, plasma density measurements, ion density measurements, and other metric probing operations. In certain embodiments, the central region of the grid is open. In other embodiments, the central region of the grid contains an optically clear material (e.g., quartz, sapphire, etc.) to allow light to be transmitted through the grid.

In some embodiments, the grid assembly may include cooling channels embedded in the grid, and these cooling channels may be filled with a flowing or non-flowing coolant material. In certain embodiments, the cooling material is a fluid such as helium or other inert gas or a liquid such as deionized (DI) water, process cooling water, Fluoroinert™ from 3M, or a refrigerant such as perfluorocarbons, hydrofluorocarbons, ammonia and $CO_2$. In these or other embodiments, the grid assembly may include embedded heating elements and/or a temperature measurement device. The cooling channels and embedded heaters allow for precise temperature control, which permit close control over the particle and wall conditions. This control may be used to tune the conditions in the lower sub-chamber, in certain cases. For example, where the lower grid or grid assembly is maintained at a cooler temperature, etch byproducts from the wafer will preferentially deposit on the lower grid, thereby reducing the gas phase density of the etch byproducts in the lower sub-chamber. Alternatively, the lower grid or grid assembly may be maintained at an elevated temperature (e.g., above 80° C.) to reduce the deposition on the grid and ensure that the chamber can remain relatively clean and/or reduce the time required to clean the chamber during waferless auto clean (WAC).

In certain embodiments, one or more of the grids may be movable with respect to the other grid(s) and/or with respect to the substrate. The movement may occur through rotation about an axis normal to the surface of the grid, and/or by moving a grid up or down along this same axis. The movement may occur between processing different substrates, or during the processing of a single substrate. This helps provide a wide range of processing conditions, thereby making the apparatus more versatile. By moving one or more grids of the grid assembly, the process conditions in the lower sub-chamber can be tuned as appropriate for a particular application. For example, by rotating one of the grids, the assembly open area may change, thereby affecting the amount of ions that are able to pass through the assembly and interact with the substrate. Often, device fabrication requires a sequence of etch operations, each conducted under different etch conditions. Such conditions may be focused by grid positioning, which provides one or more additional degrees of freedom.

In a particular embodiment, one grid rotates during etching in order to provide (a) a greater flux of ions to the substrate towards the beginning of the etching process, (b) a greater flux of ions to the substrate towards the end of the etching process, (c) repeating pulses of ion flux (i.e., ion flux on/off), (d) repeating pulses of high and low ion flux (i.e., ion flux low/high), or (e) time- and radially-dependent ion flux. In another embodiment, the flux of ions is changed as related in (a)-(d) above, but the flux is determined by the power delivered to the plasma or grid assembly, rather than (or in addition to) the position of the grids.

In order to achieve (a) a greater flux of ions to the substrate towards the beginning of the etching process, the grid may rotate to provide a greater amount of assembly open area towards the beginning of the etching process. Likewise, to achieve (b) a greater flux of ions to the substrate towards the end of the etching process, the grid may rotate to provide a greater assembly open area towards the end of the etching process. In order to achieve (c) repeating pulses of ion flux or (d) repeating pulses of high and low ion flux, the grid may rotate between alternating patterns of assembly open area. For example, the grid may rotate between a first position and a second position, where the first position achieves a first amount of assembly open area, and the second position achieves a second amount of assembly open area. Of course, more than two grid positions may be used as appropriate for a particular application. In practicing (c), at least one grid position will correspond to having zero assembly open area (i.e., at this position, no ions will be able to pass through to the lower sub-chamber). In some embodiments, etchant is delivered to the lower sub-chamber during the periods of time in which ion flux is low or zero. In other words, the substrate may be exposed to etchant and ions in alternating steps. In order to achieve (e) time- and radially-dependent ion flux, the grids of the grid assembly must be designed to work together such that rotation of a grid results in the displacement of some amount of assembly open area from one portion of the grid assembly (e.g., the edge) to another portion of the grid assembly (e.g., the center). In this way, a grid may rotate during processing to provide different levels of ion flux to different parts of the substrate during different parts of a process. As indicated, the flux may be additionally controlled by the plasma generation power as well as the bias applied to one or both grids.

The use of movable grids is particularly beneficial because it provides a wide process window of reaction conditions over the wafer in a single processing station. This benefit is especially helpful when processing complicated structures having multiple layers and/or multiple types of exposed materials. As mentioned, it is often necessary to change the processing conditions for each layer processed.

Biasing the Grid Assembly

As noted above, the grid assembly includes at least two grids, each of which has an electrical connection with a power supply allowing independent control over the bias applied to the individual grids. In some cases, each grid is connected to a separate power supply (e.g., a DC power supply). In other cases, a single power supply may provide power to multiple grids. During etching, a negative bias is applied to each grid in the assembly. The uppermost grid is biased negative such that the grid repels electrons, thereby keeping the electrons confined to the plasma in the upper sub-chamber. This confinement helps prevent bleeding of electrons into the lower sub-chamber. As such, the species in the lower sub-chamber are shielded from the high energy electrons in the upper sub-chamber plasma, and therefore do not dissociate into non-volatile materials that would be likely to re-deposit on the substrate or apparatus. Instead, because the species (especially the bulky etch byproducts) are shielded, they remain volatile and are effectively swept from the lower sub-chamber through an applied vacuum or other sweeping mechanism (e.g., gas sweep). In certain embodiments, the upper grid may be biased between about −0.5 to −50V, or between about −5 to −50 V. In a particular implementation, the upper grid is biased to about −6 V. The appropriate bias to apply to the upper grid depends on the electron energy in plasma, which depends on the pressure and the level of power supplied to generate the plasma. Where the plasma generated in the upper sub-chamber has a higher electron energy, a more substantial bias is needed to confine the plasma to this region. As such, while the bias voltages recited above may be adequate for many applications, in certain implementations the bias applied to the upper grid may be greater (i.e., more negative than −50 V).

As compared to the uppermost grid of the assembly, the lowermost grid will be biased further negative/more negative (e.g., if the upper grid is biased to −5 V, a further negative bias applied to the lower grid may be −10 V). This bias acts to accelerate positive ions from the upper sub-chamber into the lower sub-chamber and toward the surface of the substrate. These accelerated ions will have a vertical velocity component, and can therefore effectively bombard the substrate surface to activate it for etching by the reactive etch chemistry. In this way, the surface may be activated without exposing the etching chemistry to energetic electrons in the plasma which would otherwise be likely to dissociate certain chemical species.

Further, the accelerated ions will have an energy that is directly dependent upon the bias applied to the lowermost grid. As such, the ion energy may be tuned to a desired level by applying an appropriate bias on the lowermost grid. In some embodiments, the ion energy is tuned without applying a bias (or without varying a bias) to a substrate support such as an electrostatic chuck. The appropriate amount of ion energy (and therefore bias on the lowermost grid) depends on the particular substrate being processed and the specific etching conditions used. In some embodiments, the lowermost grid may be biased to between about 0.5 to −2000 V. In one specific embodiment, the lowermost grid is biased to about −12 V.

The bias applied to the grids may be constant or variable throughout an etch process. In some cases only the bias applied to the lowermost grid is varied during the etch process. Because the ion energy is determined by the bias applied to the lowermost grid, the bias on this grid may be controlled to provide ions having different energies at different points during the etch process. In one example, the bias on the lowermost grid is initially set to a relatively low "activation bias" (e.g., −8 V) for activating the substrate surface, before being set to a higher "removal bias" (e.g., between about −20 to −1000 V) towards the end of the etch process to help remove the etched material from the substrate. In many cases it is not necessary use the higher removal bias because the etched material is efficiently and effectively removed due to the volatile nature of the etch products and the fact that the grid assembly protects them from dissociation.

Another implementation in which the bias applied to the grids may be variable is where the ion flux/energy is delivered in pulses, further discussed in the Timing section below. In this case, the bias on the grid assembly (or at least the lowermost grid of the grid assembly) may vary between two or more values to provide differing levels of ion flux and/or ion energy to the lower sub-chamber. In a particular embodiment, the ion flux from the upper to lower sub-chamber is continuous while the etchant gas is supplied in pulses. In this embodiment, the ion energy may vary (by changing the bias on the lowermost grid of the grid assembly) between the times where etchant gas is on vs. off.

In some embodiments, more than two grids are used in the grid assembly. In this case, each grid may have a different degree of negative bias. The grids closer to the substrate will have greater degrees of negative bias, and the grids closer to the plasma generation sub-chamber will have lesser degrees of negative bias. In this way, the positive ions extracted from the plasma in the upper sub-chamber may be progressively accelerated through the grid assembly. In one particular embodiment, a grid assembly includes 4 individual grids, with grid A closest to the upper sub-chamber, then grid B, then grid C, and then grid D closest to the substrate. Grid A may be biased to about −6 V, grid B may be biased to about −8 V, grid C may be biased to about −10 V, and grid D may be biased to about −12 V. In some cases the differences between the biases applied to adjacent grids is substantially greater than in the previous example.

Biasing the Substrate Holder

The substrate is often supported by a substrate holder such as an electrostatic chuck positioned in the lower sub-chamber. In conventional operations, this electrostatic chuck may be biased negative to attract positive ions to the surface of the substrate. At times, the chuck is biased to such a degree that the chuck itself generates a plasma immediately above the substrate.

In the present embodiments, the substrate holder (and the substrate) may or may not be negatively biased. In certain implementations, there is no need for the substrate holder to be biased because the grid assembly itself effectively accelerates ions toward the substrate for activation. In some other cases, however, a negative bias may be applied to the substrate holder to help attract positive ions to the substrate surface. In some cases where a bias is applied to the substrate holder, the degree of the bias may be sufficiently low (in terms of frequency and/or power) such that no plasma forms in the lower sub-chamber. It is desirable in various embodiments that the lower sub-chamber be free of plasma in order to prevent dissociation of etching byproducts. In order to prevent formation of plasma in the lower sub-chamber, a bias applied to the substrate support may have a relatively low frequency (e.g., about 400 kHz or about 2 MHz or a frequency between these values). An example of a frequency that typically generates plasma above the substrate (when sufficient power is applied) is 13.56 MHz. Where the bias applied to the substrate support is at or near this value, the power supplied to the substrate support may be maintained relatively low (e.g., below about 200 W for a single 300 mm substrate) to avoid substantial plasma generation in the lower sub-chamber.

In some embodiments it may be beneficial to have a plasma in the lower sub-chamber. In these embodiments, the RF bias frequency/power applied to the substrate support may be sufficiently great to generate a plasma in the lower sub-chamber. In this embodiment it may be favorable to deliver different compositions and/or flow rates of gas to the upper and lower sub-chambers. Generally, where a plasma is present above the substrate, a bias applied to the substrate support will generate a self bias on the substrate. Where there is no plasma present above the substrate, the applied RF power to the substrate support will not result in a self bias on the substrate.

In some embodiments, the bias on the substrate holder may be pulsed. This may be especially useful where other parameters are pulsed, such as, for example, the flux of ions from the upper sub-chamber.

Conditions in the Lower Sub-chamber

In many embodiments, there is no plasma present in the lower sub-chamber during processing. As explained elsewhere herein, this helps prevent dissociation of volatile etch byproducts.

The pressure in the lower sub-chamber is typically between about 0.5-100 mTorr, or between about 0.5-5 mTorr. Among other benefits, operating at low pressure helps prevent unwanted gas phase reactions from occurring. Additionally, the pressure in the lower sub-chamber may be lower than the pressure in the upper sub-chamber, such that species present in the lower sub-chamber do not diffuse into the upper sub-chamber. In one embodiment where alternate ion activation and etchant exposure happen cyclically, the pressure in the lower sub-chamber may be somewhat higher (compared to the non-cyclic case). In this scenario, care should be taken to ensure that gases in the lower sub-chamber do not contaminate plasma in the upper sub-chamber. One technique for dealing with this issue is to sweep the gas in the upper sub-chamber before striking a plasma. The temperature of the substrate and/or lower sub-chamber may be controlled by the substrate supporter, which in many cases is an electrostatic chuck. In various cases, the temperature of the substrate and/or lower sub-chamber should be maintained between about 0-250° C.

Timing

FIG. 2, described in more detail above, provides an example of an etching process according to the embodiments herein. However, in some cases the operations may be performed in a different order, some operations may overlap, and/or some operations may be repeated.

Various process conditions may be provided in pulses (e.g., the flow of etchant gas, the flow of a second processing gas, the bias applied to one or more grids, the bias applied to the substrate holder, the flux of ions from the upper to lower sub-chamber, etc.). As used throughout the present disclosure, "pulsing" can mean changing between an "on" an "off" state, or between a "low" and a "high" state, or between more than two such states, unless otherwise specified.

In one example, the etchant gas may be provided in pulses. In other cases the etchant gas is provided continuously. Similarly, the ion flux from the upper to lower sub-chamber may be supplied either in pulses or continuously. In a particular case, the ion flux and etchant gas are provided in alternate pulses. In other words, etchant gas is supplied while there is little or no ion flux, and then ion flux is provided while little or no etchant gas is delivered. The method may be repeated until a desired etch depth is achieved.

In some cases, the surface of the substrate is bombarded with ion flux before exposure to the etchant gas.

Etch Reactor Apparatus

The methods described herein may be performed by any suitable plasma etching apparatus having at least two grids supporting appropriate negative bias. A suitable apparatus includes a chamber and electronic hardware for providing and maintaining etching conditions as described herein. A suitable apparatus also sometimes includes a controller having instructions for directing the hardware as described above and for performing a sequence of process operations appropriate for etching applications (e.g., for etching an MRAM structure or a gate electrode of a FET). In some embodiments, the apparatus may include one or more process stations included in a process tool.

Figure 5:
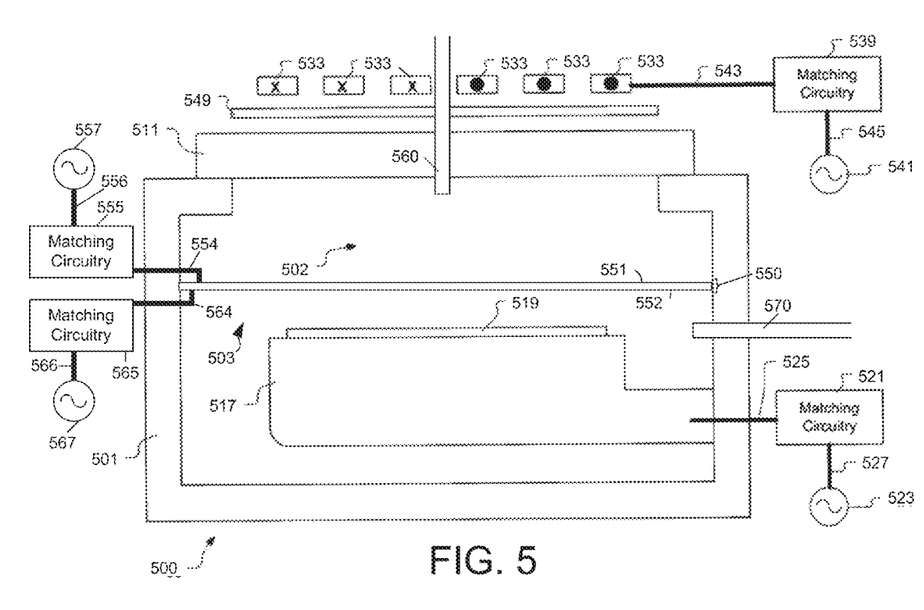
FIG. 5 shows a simplified cross-sectional view of an etching apparatus according to certain embodiments herein.

FIG. 5 provides a cross-sectional view of an inductively coupled plasma etching apparatus 500 in accordance with certain embodiments. As mentioned previously, the embodiments herein may be practiced with non-inductively coupled plasmas, as well. The inductively coupled plasma etching apparatus 500 includes an overall etching chamber structurally defined by chamber walls 501 and a window 511. The chamber walls 501 are typically fabricated from stainless steel or aluminum. The window 511 is typically fabricated from quartz or other dielectric material.

An internal plasma grid assembly 550 including upper grid (i.e., uppermost grid) 551 and lower grid (i.e., lowermost grid) 552 divides the overall etching chamber into an upper sub-chamber 502 and a lower sub-chamber 503. Each of the grids 551 and 552 contains perforations that extend through the thickness of the grid (not shown). Further, each of the grids 551 and 552 are connected with their own power supplies 557 and 567. For instance, the upper grid 551 is connected with matching circuitry 555 through connection 554, and the matching circuitry 555 is connected with the power supply 557 through connection 556. Similarly, lower grid 552 is connected with matching circuitry 565 through connection 564, while matching circuitry 565 is connected with the power supply 567 through connection 566. These power supplies 557 and 567 supply the appropriate bias to each of the grids 551 and 552. In certain other implementations, a more complex plasma grid assembly is used. During processing, plasma is generally present in the upper sub-chamber 502 and is absent in the lower sub-chamber 503.

A chuck 517 is positioned within the lower sub-chamber 503 near the bottom inner surface. The chuck 517 is configured to receive and hold a semiconductor wafer 519 upon which the etching process is performed. The chuck 517 can be an electrostatic chuck for supporting the wafer when present. In some embodiments, an edge ring (not shown) surrounds the chuck 517, and has an upper surface that is approximately planar with a top surface of a wafer, when present over chuck 517. The chuck 517 also includes electrostatic electrodes to enable the chucking and dechucking of the wafer. A filter and a DC clamp power supply may be provided for this purpose. Other control systems for lifting the wafer off of the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517.

A coil 533 is positioned above the window 511. The coil 533 is fabricated from an electrically conductive material and includes at least one complete turn. The exemplary coil 533 shown in FIG. 5 includes three turns. The cross-sections of coil 533 symbols having an "X" indicate that the coil 533 extends rotationally into the page. Conversely, the coil 533 symbols having a "•" indicate that the coil 533 extends rotationally out of the page. An RF power supply 541 is configured to supply RF power to the coil 133. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield may prevent metal or other species from depositing on the dielectric window of the plasma chamber.

Process gases may be supplied through a main injection port 560 positioned in the upper chamber and through a side injection port 570, sometimes referred to as an STG. In various embodiments, the etchant gas is supplied through the side injection port 570, while the gas used to generate the plasma is injected through the main injection port 560. Gas exhaust ports are not shown. Also not shown are pumps connected to the chamber 501 to enable vacuum control and removal of gaseous byproducts from the chamber during operational plasma processing.

Radiofrequency power is applied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The inductive current acts on the gas present in the upper sub-chamber 502 to generate a plasma in the upper sub-chamber 502. The grid assembly 550 limits the amount of plasma species that are able to migrate into the lower sub-chamber 503.

The physical and chemical interactions of the various ions and other species with the wafer 519 selectively etch features of the wafer. Volatile etching byproducts are removed from the lower sub-chamber 503 through an exhaust port (not shown). Importantly, these volatile byproducts are not substantially exposed to high energy electrons in the plasma, and are therefore not likely to dissociate into non-volatile byproducts.

Typically, the chuck disclosed herein operates at elevated temperatures ranging between about 30° Celsius and about 250° Celsius, preferably between about 30-150° Celsius. The temperature will depend on the etching process operation and specific recipe.

Although not shown, chamber 501 is typically coupled to facilities when installed in a clean room or a fabrication facility. Facilities include plumbing that provide processing gases, vacuum, temperature control, and environmental particle control. These facilities are coupled to chamber 501 when installed in the target fabrication facility. Additionally, chamber 501 may be coupled to a transfer chamber that will enable robotics to transfer semiconductor wafers into and out of chamber 501 using typical automation.

System Controller

In some embodiments, a system controller (which may include one or more physical or logical controllers) controls some or all of the operations of a process tool. The system controller will typically include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing, mixture of process gas components (e.g., the composition of the etchant gas and the composition of the gas used to generate the plasma), chamber pressure, chamber temperature, wafer temperature, current and potential applied to the chuck/wafer and any other electrodes, the bias applied to each of the grids of the grid assembly, wafer position, and other parameters of a particular process performed by the process tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequence instructions for controlling the various parameters described above. For example, each phase of an etching process may include one or more instructions for execution by the system controller. The instructions for setting process conditions for a plasma generation process phase may be included in a corresponding plasma generation recipe phase. In some embodiments, the etching recipe phases may be sequentially arranged, so that all instructions for an etching process phase are executed concurrently with that process phase.

Other computer software and/or programs may be employed in some embodiments. Examples of programs or sections of programs for this purpose include a substrate positioning program, a plasma gas composition control program, an etching gas composition control program, a gas inlet timing control program, a grid assembly bias control program, a grid assembly position control program, an electrostatic chuck bias control program, a pressure control program, a heater control program, and a potential/current power supply control program. Any of the software/programs mentioned herein may contain instructions for modifying the relevant parameters during etching. In one example, a grid assembly bias control program may contain instructions to modify the bias to one or more grids of the grid assembly during etching. As a consequence, the ion energy of the ions traveling into the lower sub-chamber may be modified during the etch process.

In some cases, the controllers control one or more of the following functions: delivery of etchant gas to the lower sub-chamber, delivery of plasma generation gas to the upper sub-chamber, plasma generation conditions in the upper sub-chamber, the bias applied to each grid of the grid assembly, etc. For example, the delivery of gas to the sub-chambers may be achieved by directing certain valves to open and close at particular times. This allows the controller to control both the timing of gas delivery, as well as the composition of the delivered gases. The controller may control plasma generation conditions by, for example, directing a power supply to provide power to a plasma generator (e.g., the coils of an ICP reactor) at particular frequencies/power levels. Further, the controller may control the plasma generation conditions by directing a flow of inert gas (and/or in some embodiments reactive gas) to enter the upper sub-chamber, or by controlling the pressure in the sub-chambers, or by controlling the temperature in the sub-chambers, etc. The controllers may control these aspects based on sensor output (e.g., when current, current density, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6)

removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of etching a substrate, comprising:
   (a) receiving a substrate having material for removal thereon in a reaction chamber of a reactor, wherein the reactor comprises:
      (i) an upper sub-chamber and a lower sub-chamber,
      (ii) a grid assembly positioned in the reaction chamber and thereby dividing the reaction chamber into the upper sub-chamber and the lower sub-chamber, wherein the grid assembly comprises at least an uppermost grid and a lowermost grid, wherein the uppermost and lowermost grids are connected with one or more power supplies for independently providing negative bias to the grids, and wherein each grid of the grid assembly has perforations extending through the thickness of the grid,
      (iii) one or more inlets to the upper sub-chamber,
      (iv) one or more inlets to the lower sub-chamber, and
      (v) a plasma generation source designed or configured to produce a plasma in the upper sub-chamber,
   (b) supplying a plasma generating gas to the upper sub-chamber and generating the plasma from the plasma generating gas,
   (c) applying a negative bias to at least the uppermost and lowermost grids of the grid assembly, wherein the bias applied to the lowermost grid is more negative than the bias applied to the uppermost grid, and accelerating ions from the plasma in the upper sub-chamber through the grid assembly toward the substrate,
   (d) supplying an etching gas to the lower sub-chamber through the one or more inlets to the lower sub-chamber, and
   (e) etching the substrate to remove at least a portion of the material for removal, wherein the lower sub-chamber is substantially free of plasma during operations (a)-(e).

2. The method of claim 1, wherein the bias applied to the uppermost grid is between about −0.5 to −50 V.

3. The method of claim 1, wherein the bias applied to the lowermost grid is between about −0.5 to −2000 V.

4. The method of claim 1, further comprising changing the bias applied to at least one grid of the grid assembly during operation (c).

5. The method of claim 1, wherein the etching gas in operation (d) is supplied in pulses.

6. The method of claim 1, wherein the plasma generating gas comprises a reactive gas.

7. The method of claim 1, further comprising supplying a processing gas to the lower sub-chamber and reacting the processing gas with the material for removal to form a reacted layer for removal comprising a material selected from the group consisting of an oxide, a nitride, a hydride, a chloride, a fluoride, organometallic complexes, or a combination thereof.

8. The method of claim 7, further comprising reacting the reacted layer for removal with the etching gas to remove the reacted layer for removal.

9. The method of claim 1, further comprising moving at least one grid of the grid assembly during at least one of operations (b)-(e).

10. The method of claim 1, wherein ions present in the upper sub-chamber accelerate through the grid assembly and interact with a surface of the substrate.

11. A method of etching a substrate, comprising:
   (a) generating a plasma in an upper region of a plasma reactor;
   (b) applying a first negative DC bias to a first grid in the plasma reactor and applying a second negative DC bias to a second grid in the plasma reactor, the first and second grids separating the upper region of the plasma reactor from a lower region of the plasma reactor, and accelerating ions from the plasma onto a surface of the substrate in the lower region of the plasma reactor, wherein the plasma does not contact the substrate;
   (c) delivering an etchant gas to a surface of the substrate where the etchant gas reacts to etch metal or semiconductor from the surface and produce a volatile byproduct containing one or more atoms of the metal or semiconductor and one or more ligands from the etchant gas; and
   (d) removing the volatile byproduct from the plasma reactor without having the byproduct substantially contact the plasma and without having the volatile byproduct substantially dissociate to a less volatile material.

12. The method of claim 11, wherein the etchant gas reacts in (c) to etch a metal selected from the group consisting of Fe, Mn, Ni, Mg, Pt, Pd, Co, Ru, Cu, Ir, and a combination thereof.

* * * * *